United States Patent
Wakefield et al.

(10) Patent No.: US 11,493,971 B2
(45) Date of Patent: Nov. 8, 2022

(54) POWER ESTIMATION SYSTEM

(71) Applicant: Synopsys, Inc., Mountain View, CA (US)

(72) Inventors: Alexander John Wakefield, Fort Lauderdale, FL (US); Khader Abdel-Hafez, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/240,770

(22) Filed: Apr. 26, 2021

(65) Prior Publication Data

US 2021/0333853 A1  Oct. 28, 2021

Related U.S. Application Data

(60) Provisional application No. 62/704,204, filed on Apr. 27, 2020.

(51) Int. Cl.
| | |
|---|---|
| *G06F 1/26* | (2006.01) |
| *G06F 11/34* | (2006.01) |
| *G06F 11/30* | (2006.01) |
| *G06F 11/27* | (2006.01) |
| *G06F 11/263* | (2006.01) |

(52) U.S. Cl.
CPC ............ *G06F 1/26* (2013.01); *G06F 11/263* (2013.01); *G06F 11/27* (2013.01); *G06F 11/3058* (2013.01); *G06F 11/3409* (2013.01); *G06F 11/3447* (2013.01)

(58) Field of Classification Search
CPC .......... G06F 1/26; G06F 11/27; G06F 11/263; G06F 11/3409; G06F 11/3058; G06F 11/3447
USPC ...................................... 713/300; 714/30, 32
See application file for complete search history.

(56) References Cited

U.S. PATENT DOCUMENTS

| | | | |
|---|---|---|---|
| 8,429,593 B1* | 4/2013 | Thirunavukarasu | G01R 31/318533 716/136 |
| 2006/0174144 A1* | 8/2006 | Kim | G06F 1/3228 713/300 |
| 2007/0156356 A1* | 7/2007 | Thirunavukarasu | G01R 31/318575 702/57 |
| 2012/0283981 A1* | 11/2012 | Inoue | G01R 31/318385 702/120 |
| 2015/0247899 A1* | 9/2015 | Sofer | G01R 31/318575 324/762.03 |
| 2016/0188772 A1* | 6/2016 | Seo | G06F 30/398 716/109 |

* cited by examiner

*Primary Examiner* — Ji H Bae
(74) *Attorney, Agent, or Firm* — Nicholson De Vos Webster & Elliott LLP; Judith Szepesi (57) ABSTRACT

A method of power test analysis for an integrated circuit design including loading test vectors into a first sequence of flip-flops in scan mode, evaluating the test vectors and saving results of the evaluating in a second sequence of flip-flops in scan mode, reading results out of the second sequence of flip-flops to a scan chain, and calculating power generation based on the results. In one embodiment, the test vectors are received from an automatic test pattern generator.

19 Claims, 11 Drawing Sheets

POWER ESTIMATION SYSTEM

PRIORITY

The present application claims priority to U.S. Provisional Application No. 62/704,204, filed on Apr. 27, 2020, and incorporates that application in its entirety.

FIELD

The present disclosure relates to power analysis, and in particular to power estimation based on analysis of test patterns without simulation or emulation.

BACKGROUND

Test patterns are used to verify the integrity of a manufactured silicon circuit. A fabricated chip is placed into a test machine and patterns are input into the device using a scan chain. The test patterns input are optimized to provide maximum control and visibility of manufacturing defects.

During scan testing the test patterns are loaded into the circuit serially via a set of scan chains. During this loading process the number of toggles inside the circuit is high and the peak glitch power can overload the tester or damage the silicon.

To eliminate these power concerns, circuit with test patterns may be simulated with Standard Delay Format (SDF) delays, then power calculations are performed. This gate-level simulation and power estimation is slow and due to the length of the test vectors, this process can take a substantial amount of time (e.g., weeks) to perform even using a compute grid.

Emulation does not solve this issue as detailed delay information is required which emulators typically do not support.

Detailed and accurate power calculations using all waveforms is slow, but it is needed using either emulation or simulation output.

BRIEF DESCRIPTION OF THE FIGURES

The present disclosure is illustrated by way of example, and not by way of limitation, in the figures of the accompanying drawings and in which like reference numerals refer to similar elements and in which.

DETAILED DESCRIPTION

The present application solves the problem of power analysis for test vectors by eliminating gate-level simulation or emulation. Test pattern data is directly calculated using an integrated waveform and power engine approach. In one embodiment, the test pattern data is received from an automatic test pattern generator which calculates the relevant data, enabling the simulation of a particular pattern or cycle of interest, without requiring simulation of the prior cycles serially to reach the cycle of interest. Using initial state data generated by the automatic test pattern generator enables faster simulation, as well as partial simulation, and also removes the need to decompress compressed scan chains. Test patterns include a series of 0/1 values that will be shifted into the silicon device using a serial scan chain. This set of pattern data is the values for each sequential cell in the scan chain. From the test pattern data, the system can directly identify the values of all scan-elements in the design for the entire test.

Waveform calculation techniques are then used to calculate the values for all combinational cells if the sequential values are known. The values of all sequential cells are known from the scan chain; thus, this approach can calculate all nodes in the design efficiently. An integrated power engine can then perform fast approximate power estimation on the gate-level netlist using the waveform values for each node.

This provides a rapid power estimation. Because the initial state data applies to the relevant subset of transitions, the power estimator will provide data much more rapidly. This power calculation can be performed after each test vector is generated, and any vectors that exceed the maximum power value can be re-generated. This results in a test vector set that meets the power requirements.

In one embodiment, scan vectors are also concatenated to form a long series of scan tests. Each of these vectors overlaps with the next/preceding set. One vector is read out of the silicon while the next vector is loaded into the silicon. The power calculation is a combination of toggles during vector read and toggles during next vector load. Calculating power for each vector individually allows the system to re-order and calculate the power for all combinations of patterns, enabling optimal order to meet power requirements. Thus, the power estimation system provides a fast, relevant, and accurate power estimation for all combination of patterns, enabling the selection of the optimal order of patterns for the power requirements for an integrated circuit.

Figure 1A:
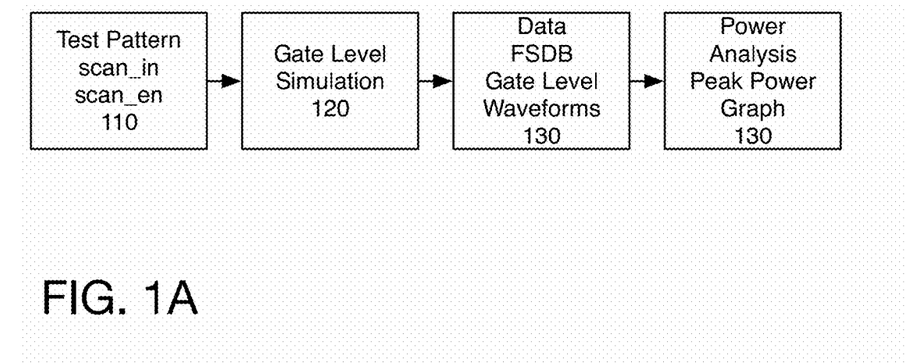
FIG. 1A illustrates one embodiment of an approach to power estimation of test vector stimulus.

FIG. 1A illustrates one embodiment of an approach to power estimation of test vector stimulus. In one embodiment, the process includes generating test vectors using a test pattern generator at 110. The process further includes simulating or emulating the test vectors on a gate-level netlist with SDF delays at 120. The process further includes saving waveforms in a fast signal database (FSDB) or another waveform format at 130, and performing cycle-based power analysis using a power analysis system at 140.

The power analysis system, as will be described in more detail below, determines the peak power and determines whether the test vectors meet the power requirements for the circuit.

In one embodiment, test vectors are loaded into the design using a serial scan chain. This allows any sequential flop to be controlled by loading the required data via the scan chain. These sequential cells would otherwise be difficult or impossible to control using the design logic.

Figure 1B:
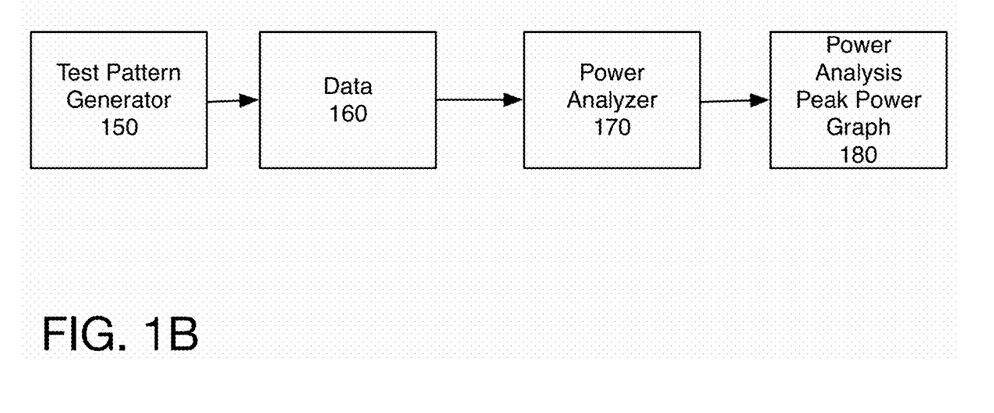
FIG. 1B illustrates one embodiment of an improved approach to power estimation.

FIG. 1B illustrates one embodiment of the present system and method for providing power estimation. A test pattern generator 150 generates test patterns, and data 160 is passed to a power analyzer 170, which generates a peak power graph 180. In comparison to the approach illustrated in FIG. 1A, this approach does not utilize gate level simulation. This makes it more efficient in terms of time as well as compute cost.

Figure 2:
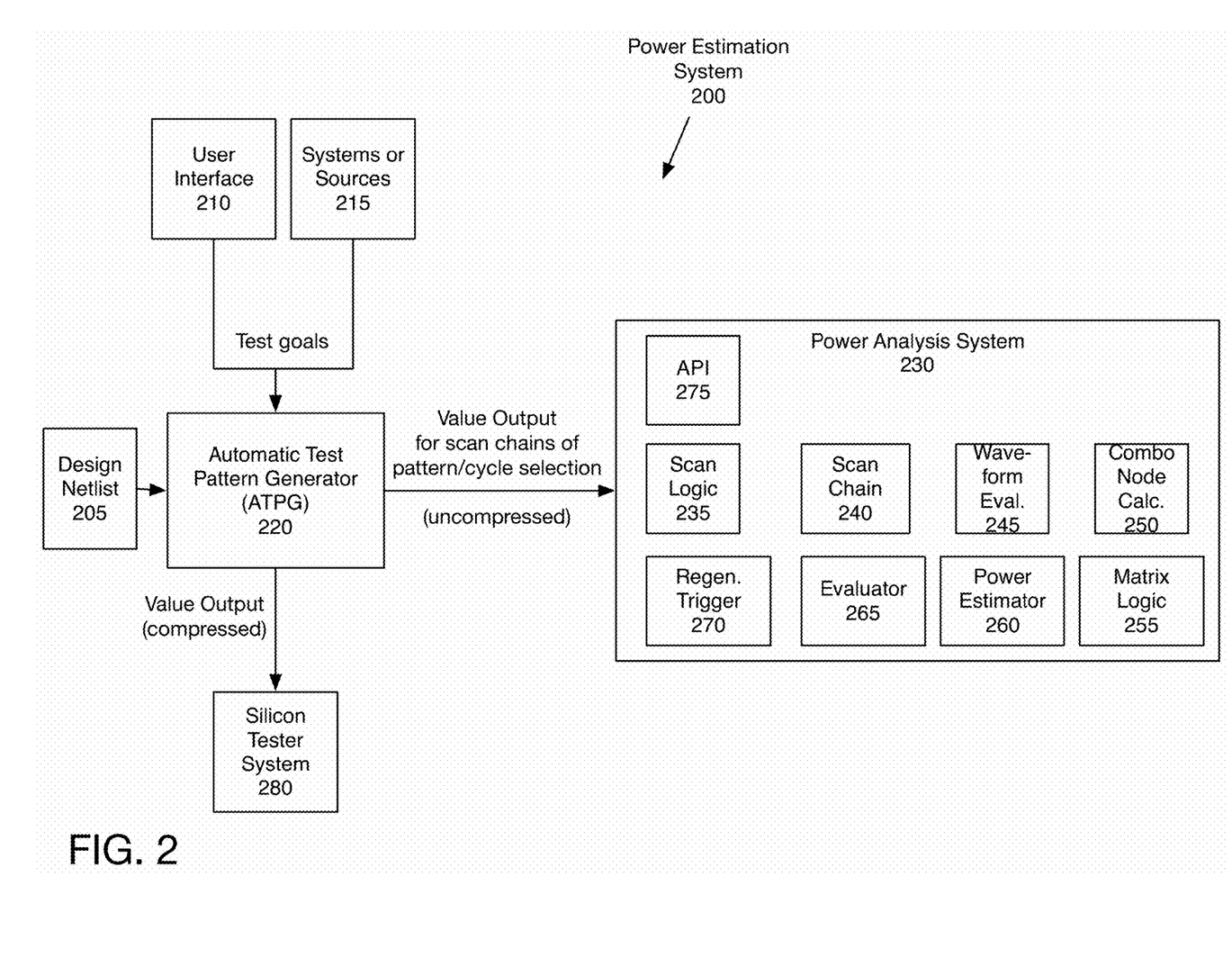
FIG. 2 is a block diagram of one embodiment of the power estimation system.

FIG. 2 is a block diagram of one embodiment of the power estimation system. The power estimation system 200 includes an automatic test pattern generator 220 and a power analysis system 230. The power estimation system 200 in one embodiment is implemented in a computer system. In one embodiment, the different portions of the power estimation system 200 may be implemented in different systems. The power estimation system 200 is used in integrated circuit design and/or validation, to ensure that the power requirements can be met, as will be discussed below. The present system provides an improved power estimation system, which provides a technical improvement in the design and testing of circuits such as field programmable gate arrays (FPGAs), application specific integrated circuits (ASIC), etc.

The input to the automatic test pattern generator 220 is a design typically in netlist format 205. The netlist represents an integrated circuit design, or a portion of an integrated circuit design. In one embodiment, the test goals are selected by a user via user interface 210. The test goals identify the subset of cycles of interest, for evaluation. In one embodiment, the test goals also identify the portion of the integrated circuit of interest, for evaluation. In one embodiment, the system is used to evaluate a subset of cycles which are likely to cause power spikes or exceed capacity. In one embodiment, the user may identify such cycles. In another embodiment, other systems 215 may identify such cycles for evaluation.

The automatic test pattern generator (ATPG) 220 receives a request for the state of sequential elements for the selected shift and/or capture cycle. The ATPG 220 provides a value output for the power analysis system. The ATPG 220 utilizes the test pattern generation to determine the states for the relevant elements, for the selected patterns/cycles. The relevant elements may include one or more of scan elements, non-scan elements, whether sequential or combinatorial. The ATPG 220 may output any combination of the initial and final states of elements.

In one embodiment, the ATPG 220 outputs the initial state of all scan elements and non-scan elements for which a value can be determined. In one embodiment, this encompasses most non-scan elements of a design. In another embodiment, ATPG 220 provides the initial and final state of all scan and non-scan elements in a design. In another embodiment, ATPG 220 provides the initial state of all scan and non-scan elements as well as the initial state of all combination elements. In another embodiment, ATPG 220 provides the initial and final state of scan and non-scan elements, as well as the initial and final state of combinational elements. The ATPG 220 is able to provide initial state of all scan elements, the initial state of the non-scan elements, and the initial state of the sequential elements for the selected pattern/cycle selection.

The power analysis system 230, in one embodiment, receives the value outputs from the ATPG 220. In one embodiment, the value outputs are uncompressed. In one embodiment, the value outputs are the initial states of some or all of the elements in the relevant segment of the circuit. In one embodiment, the initial states of the sequential scan, sequential non-scan, and combinatorial elements may be provided to the power analysis system 230. In one embodiment, the ATPG 220 provides compressed outputs to a silicon tester system 280 for manufacturing tests, diagnosis, and failure analysis, after a chip is produced. The silicon tester system 280 applies ATPG patterns to manufactured devices for verifying chip functionality.

Scan logic 235 scans the data into the scan chains 240. The data used by the scan logic 235 is the initial state data provided by the ATPG 220. The data in the scan chains 240 are then evaluated by waveform evaluator 245, before being scanned out by scan logic 235. The scanning in and out may be done in parallel, as will be discussed below. The waveform evaluator 245 may be any waveform evaluator. The waveform evaluator evaluates the design logic between the sequential elements to calculate the values of the destination sequential elements for one or more cycles of design-evaluation clocks.

The combination node calculator 250 calculates the power generated, as a combination of two test patterns, using the scan chain-based evaluation, as will be described in more detail below. The matrix logic 255 identifies the ordering of the patterns to choose the lowest power values and identify the lowest power path. The matrix logic 255 utilizes the power matrix, which includes power values as a N×N matrix—one row for each pattern that will run first and one column for every pattern that will run second. The matrix logic 255 analyzes the power logic to identify the ordering of the patterns, based on the lowest combined power values.

Power estimator 260 executes the tests in the identified order, and measures the power with the overlapping patterns. In one embodiment, a scan chain 240 is used by the power estimator 260. The power results are evaluated by evaluator 265, to determine whether they meet the power criteria. If not, the regeneration trigger 270 triggers regeneration of patterns. In one embodiment, the power analysis system 230 can trigger the automatic test pattern generator 220 through application programming interface (API) 275, to generate updated patterns, or provide subsequent data.

Figure 3:
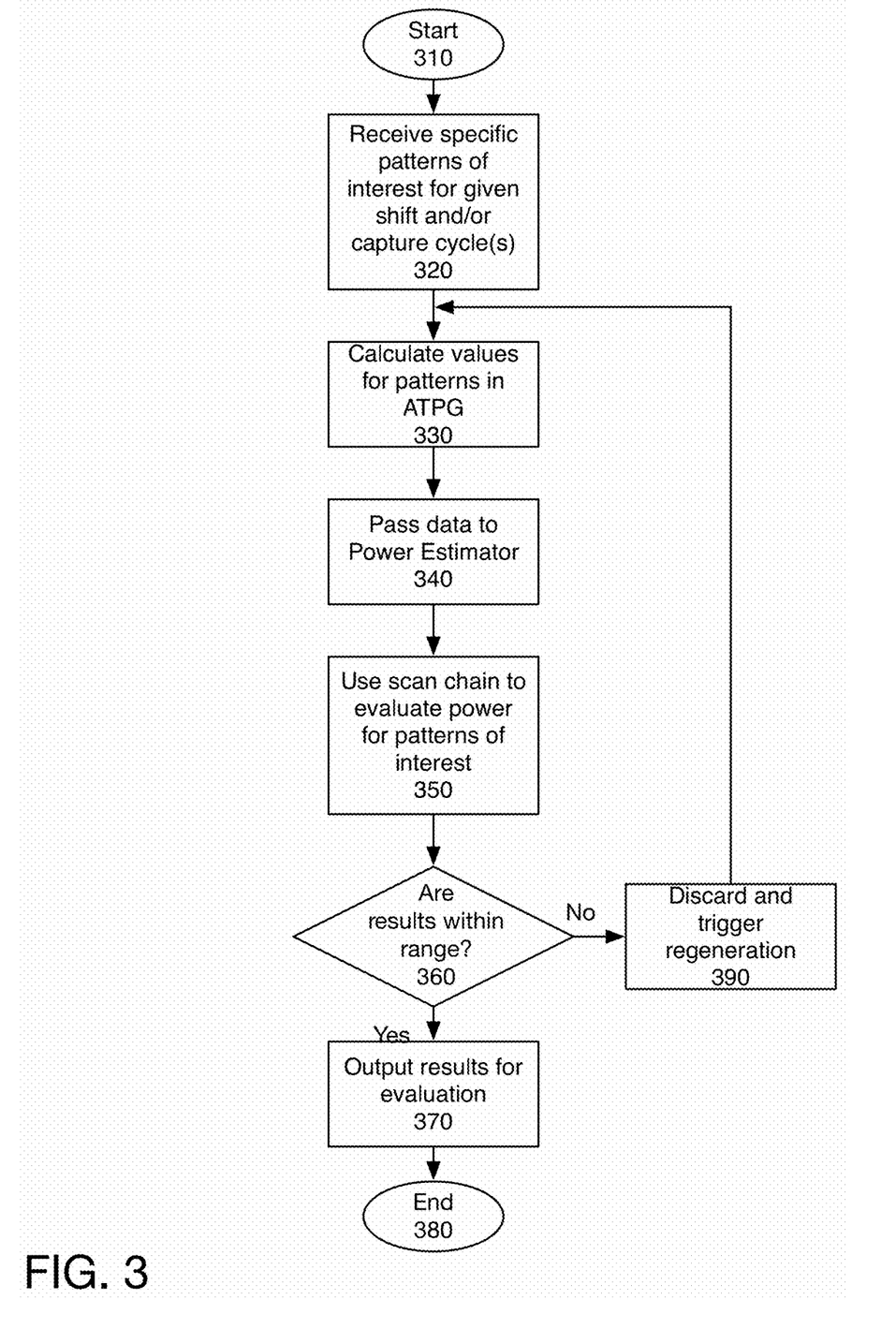
FIG. 3 is an overview flowchart of one embodiment of the power estimation process.

FIG. 3 is a flowchart of one embodiment of using the power estimation system. The process starts at 310. In one embodiment, this process is part of the logic design and functional verification process of circuit design.

At 320, the specific patterns of interest for a given shift and/or capture cycle is received by the system. In one embodiment, this data may be selected by the user. In one embodiment, other systems may identify the particular patterns which are likely to cause power surges or spikes, and those patterns are used.

At 330, the ATPG calculates the state data to be passed to the power estimator. The state data may include the initial states of some or all of the sequential scan, sequential non-scan, and combinatorial elements for the selected shift/capture cycle(s). The state data may include, additionally or alternatively, the final states of these elements.

At 340, the state data is passed to the power estimator. In one embodiment, the data is passed in its uncompressed state from the ATPG. In another embodiment, a separate system may be used to uncompress the data.

Figure 4:
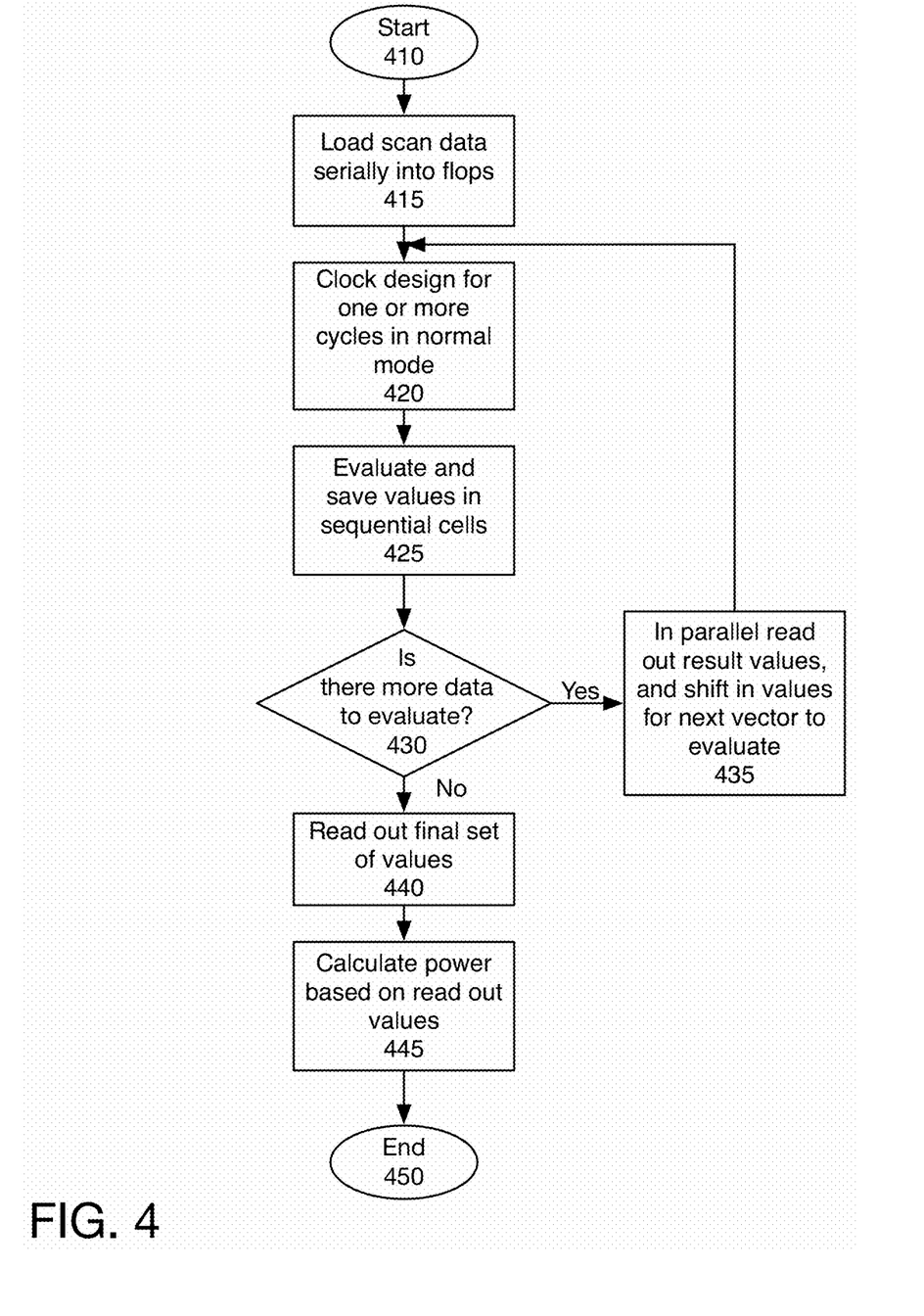
FIG. 4 is a flowchart of one embodiment of the power analysis system using an integrated waveform and power engine approach.

At 350, the scan chains are used to evaluate the power for the patterns of interest. FIG. 4 provides one embodiment of this calculation. Other methods of calculating the power, based on the starting and/or ending states of the elements, may be used.

At 360, the process determines whether the values are in range. The values are considered to be in range if they do not exceed the maximum power, nor drop below a threshold. If the results are within range, at 370, the results are output for evaluation. In one embodiment, this may include outputting power curves on a user interface for a user. The process then ends, at 380.

If the results are not within range, they are discarded, and regeneration of the state data is triggered, at 390. In one embodiment, the system may alert the user that the results were outside the range. In one embodiment, these results may also be made available for evaluation, and may be flagged.

FIG. 4 is a flowchart of one embodiment of using the scan chain to evaluate the power. In one embodiment, FIG. 4 corresponds to 350 of FIG. 3. Returning to FIG. 4, the process starts at 410, where the data is received from the ATPG.

At 415, the scan data is serially loaded into flops. The scan data represents the initial state of the elements being evaluated, received from the ATPG. The scan data is the initial state data received from the ATPG.

At 420, the design is clocked for one or more cycles in normal mode. This moves the state forward by the number of cycles.

At 425, the system evaluates the cycles, and saves the values in sequential cells.

At 430, the process determines whether there is more data to evaluate. That is, whether there remains any unevaluated data. If so, the process continues to 435.

At 435, the results are read out and, in parallel, the values for the next evaluation are shifted into the flops. This enables the parallel processing of the data, and speeds up evaluation. The process then returns to 420, to clock the design with the additional scan data.

If, at 430, no further unevaluated data was found, at block 440 the final set of values is read out of the scan chain. The saved data is then used to calculate power, at 445. The process then ends at 450.

Figure 5:
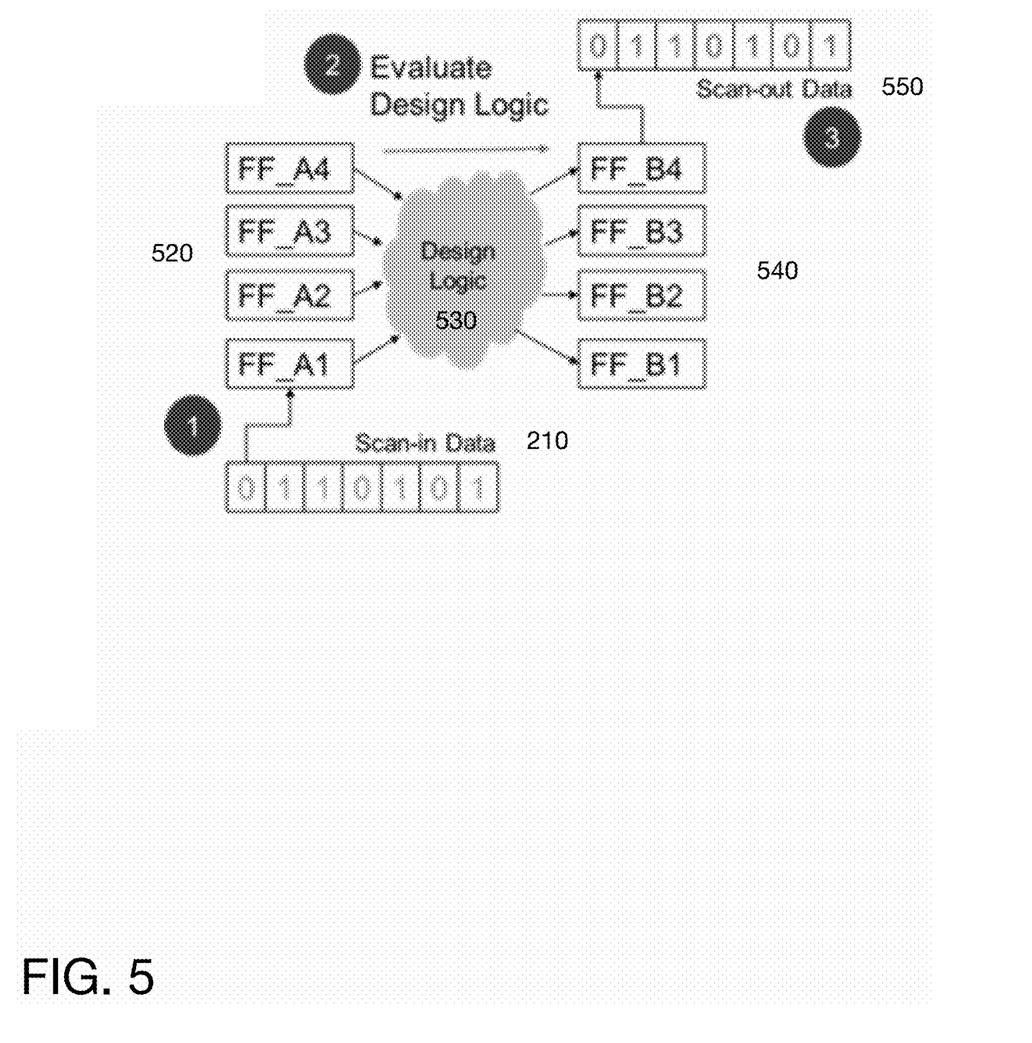
FIG. 5 illustrates a simplified diagram of one embodiment of the elements involved in the process.

FIG. 5 illustrates a simplified diagram of one embodiment of the elements involved in the power evaluation process. The scan-in data 510 is loaded serially into the flops 520, FF_A1 through FF_A4.

This scan chain is a set of sequential elements connected and controlled by scan logic. In 'scan-mode,' the input to each flop is driven from the prior flop in the scan chain. Using this method, sequential elements can be loaded serially using scan_enable and scan_in data pins. For a scan chain with 1000 sequential elements, 1000 clock cycles are needed to serially load all the data into the design.

Test pattern generators typically generate a set of compressed patterns that are then uncompressed by a circuit present on the silicon. This allows the test patterns to be smaller and, in many cases, multiple scan chain data can be derived from a single compressed test pattern. The uncompressed patterns are then provided to the present waveform and power calculation system and method.

A subset of uncompressed patterns may be provided to the present waveform and power calculation system and method. The test pattern generator may perform some toggle-based analysis of the uncompressed patterns to determine which patterns, or which slices of a pattern, are more likely to cause a peak power event. These patterns or slices can then be analyzed using the process described.

The design is then clocked for one or more cycles in normal (non-scan) mode. All of the design logic 530 will evaluate and new design values will be saved in the sequential cells, FF_B1 through FF_B4 540. The scan chain is then shifted again, and in one embodiment, the result from the design evaluation phase is shifted out of the design using the same scan chain logic as scan-out data 550. For a scan chain of 1000 sequential elements, 1000 clock cycles will be used to serially read all the data from the design.

Figure 6:
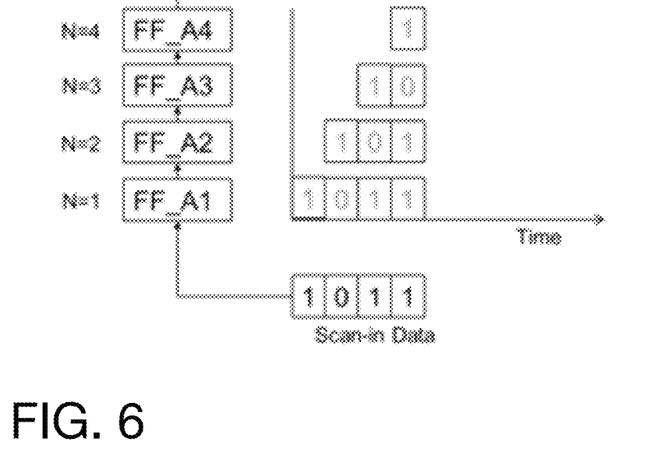
FIG. 6 illustrates one embodiment of loading scan data.

The values for all sequential elements are known during the scan-load phase. As shown in FIG. 6, as the scan data is loaded into the design, each sequential element at scan-chain position #N will have a value specified by scan_data[T−N].

Figure 7:
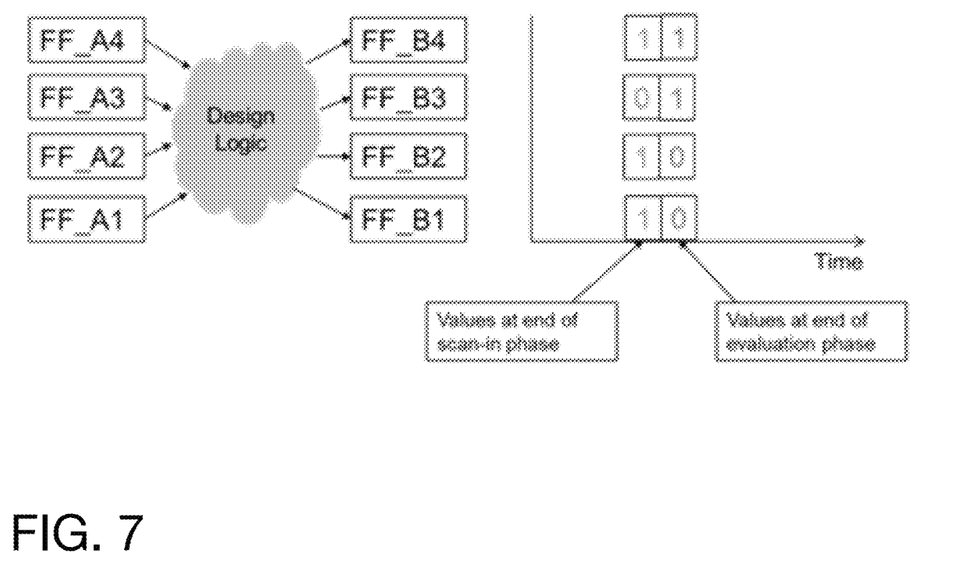
FIG. 7 is a block diagram of one embodiment of the evaluation between the sequential elements.

During the evaluation phase of the design, all sequential elements are known. Waveform evaluators can evaluate the design logic between the sequential elements, to calculate the values of the destination sequential elements, as illustrated in FIG. 7. This can be used for one cycle, or for any number of design-evaluation clocks.

Figure 8:
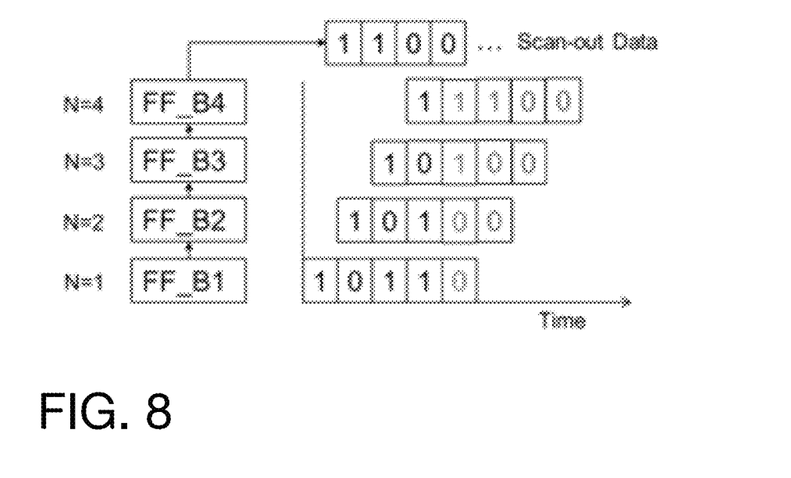
FIG. 8 illustrates the exemplary values for sequential elements.

During the scan-read phase the sequential values are read out of the design using the scan chain. The value for each sequential element flows through the scan chain, and the values are known from the preceding step, each sequential element at position T has scan_data[T+N], as illustrated in FIG. 8.

Figure 9:
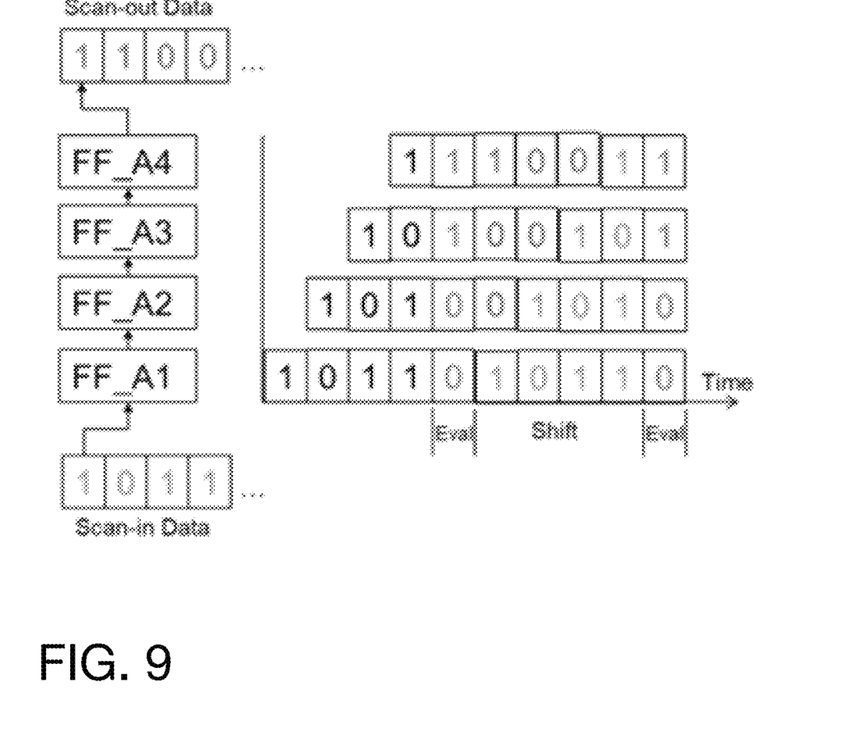
FIG. 9 illustrates the evaluation sequence over time.

In one embodiment, the scan-load and scan-read phases occur in parallel. When data values for vector M are read out of the design, the scan-chain values for vector M+1 are loaded into the design. A combination of two patterns is used to calculate the power. FIG. 9 illustrates a simplified example of this sequence over time. The data is shifted in for four cycles, in this example, and then evaluated for one cycle. In this way, over time, the data is evaluated.

To calculate the power of the gate-level design during scan load/read phases, the values for every sequential element are used. Waveform evaluation techniques are then applied to calculate the value for every combination node in the circuit without requiring a sequential simulation of the design.

To calculate the values of each sequential cell, in one embodiment, two approaches are used.

As data is scanned into the design the test vector data will flow through the scan chain. All sequential element values can be determined from the test-vector data, e.g. sequential element value[N]=scan_vector[T−N]

As the data is read out of the design, the values from the evaluation phase are shifted through the scan chain. All sequential element values can be determined from the design-evaluation data, e.g. sequential element value [N]=design_evaluation_value[T+N]

The values for all sequential cells can be determined using the above methods. As the sequential values are now known for the full test-vector load/store phase, the values of all combinational nodes can be calculated. This can be accomplished by either running a simulation method to evaluate all nodes at time t1, t2, t3 or a waveform evaluation method.

If waveform evaluation is used, in one embodiment, then every gate in the circuit can be evaluated once. The input-pin values are known, and the cell can be evaluated once for all output pin values. This has the advantage of eliminating races and allowing the design to be efficiently scheduled on a multi-thread or multi-host compute environment. Dynamic scheduling of tasks is simplified as there is no cycle by cycle communication between compute threads.

The design evaluation then occurs when the design is put into normal mode and one or more clock cycles are evaluated. In this case the design logic is evaluated and the values for each flop are driven by the design logic (not the test/scan logic). Evaluation of the design occurs using the same technique as scan load/read phase, in one embodiment.

As waveforms are now known for all sequential and combinational cells in the design, they can be used in different types of power estimation methods. The methods may be more accurate, and more complex and slower, or less accurate and, less complex, and faster. This will result in average and peak power results for the test pattern.

In one embodiment, this power calculation can be initiated by the test pattern generator to calculate power. If the power exceeds the maximum value, the test pattern can be discarded and re-generated with a different sequence of values. This results in a set of test patterns that meet the power goals.

The power generated during test pattern execution is a combination of two test patterns. As the result from the first test pattern is read out, the next test-pattern is read into the design. To calculate the power of the patterns, both are available and used at the same time.

This overlap means that the power generated depends on the order of the patterns, and by re-ordering the test patterns the power can be optimized. It is possible that a combination of two patterns causes a large power spike, but when each of the individual patterns is paired with different patterns, the spike is not observed.

As the scan chain is ordered based on layout or other information, in one embodiment, the scan flops in the design are in some arbitrary but fixed order. Combinational logic driven by a set of sequential elements will have data from both the new scan pattern and the results from the previous pattern.

Figure 10A:
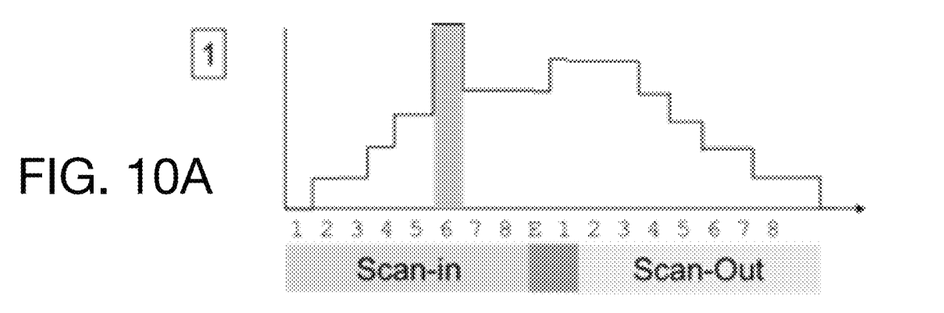
FIGS. 10A-10C illustrate exemplary peak power patterns.
Figure 10B:
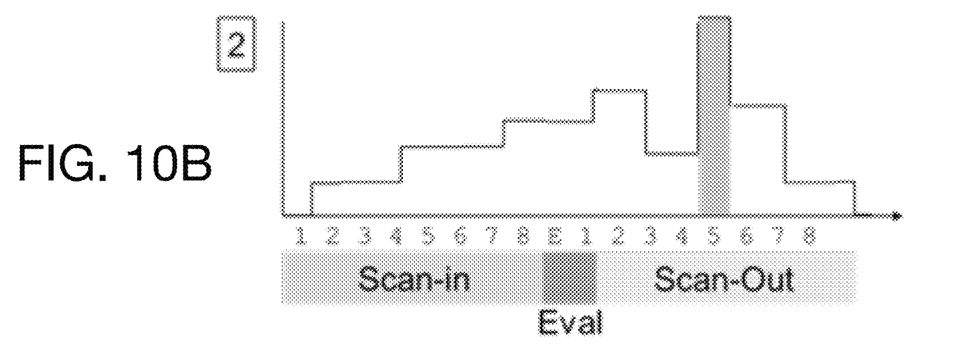
Figure 10C:
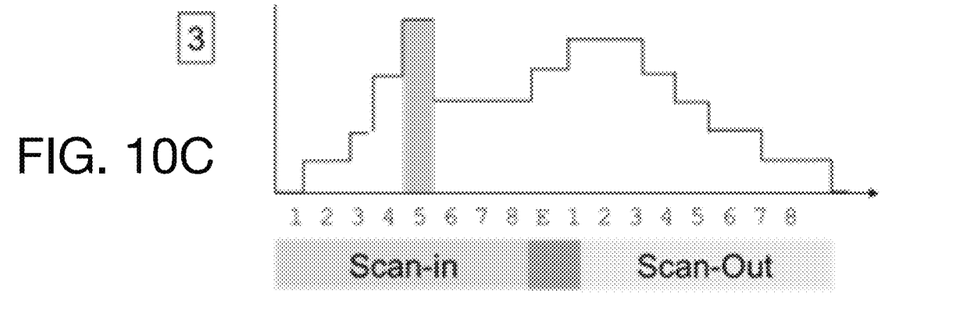

The peak power from various patterns can occur at different cycles within each pattern. FIGS. 10A-10C illustrates exemplary peak power patterns.

For example, if patterns are executed order 1+2+3 then the peak power of scan-out of pattern #2 (cycle 5) lines up with peak power of pattern #3 scan-in (cycle-5). If the patterns are re-ordered to be 3+2+1 then these peaks do not line up and maximum power is reduced.

In one embodiment, each pattern can be executed with next/prior data of fixed 0x0 and 0x1 and the pattern power from both runs may be averaged. Then the power graph for each pair of patterns can be summed with scan-out+scan-in times aligned and the peak power calculated.

In one embodiment, each power value is placed into a N×N matrix—one row for each pattern that will run first and one column for every pattern that will run second. The matrix will have a set of blank entries when row=column. This matrix is also referred to as a power matrix.

Figure 11A:
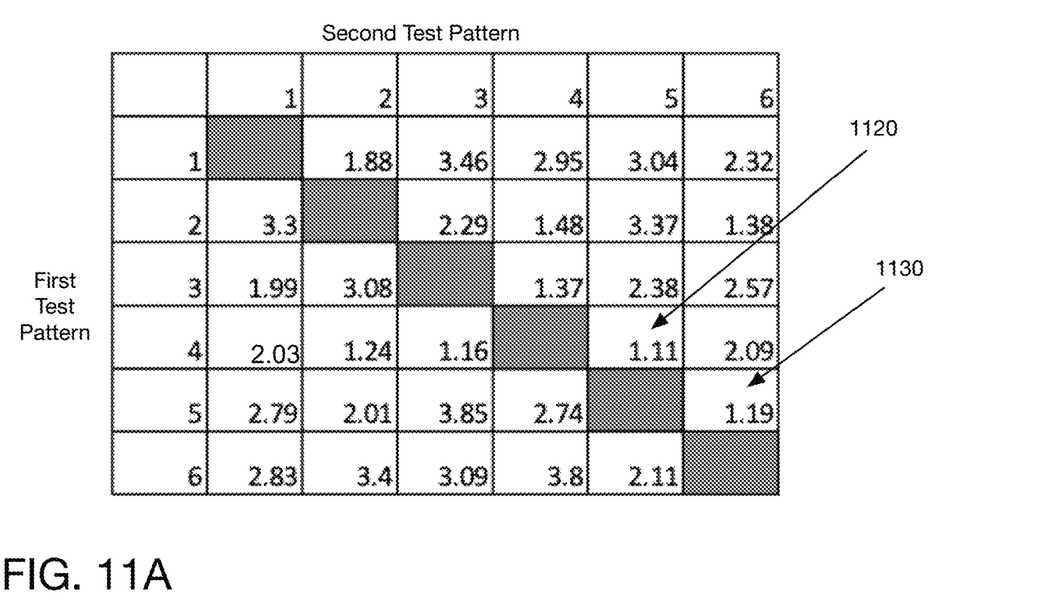
FIG. 11A illustrates an exemplary matrix.

FIG. 11A illustrates an exemplary matrix.

Figure 11B:
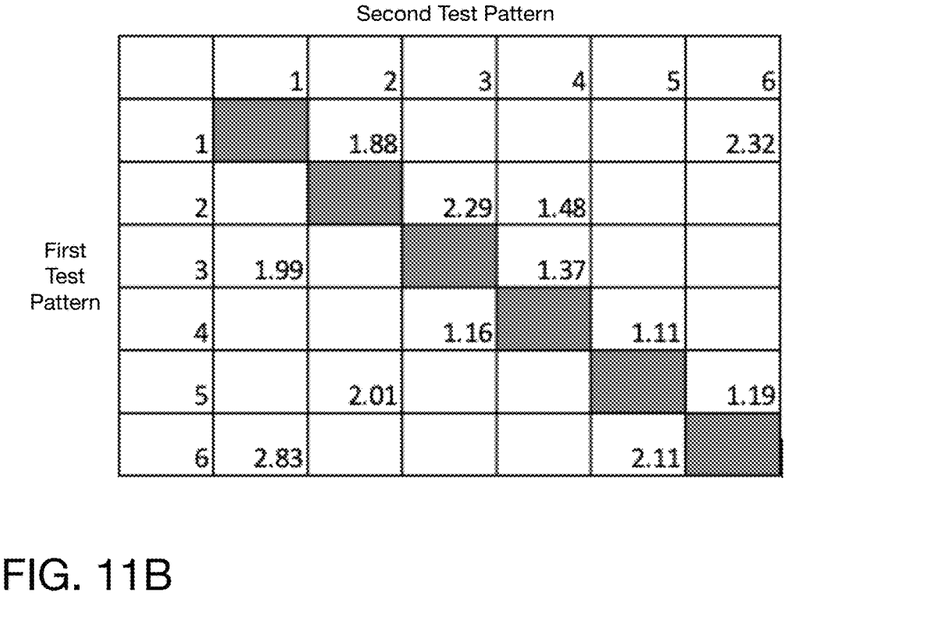
FIG. 11B illustrates the matrix of FIG. 11A, after processing.

In one embodiment, the process then removes all entries where the power exceeds the maximum value. FIG. 11B illustrates the matrix after such entries are removed. If any row is empty, then this pattern power with any other pattern will exceed the maximum power value. In one embodiment, the solution is to remove this pattern and re-generate it. The system can repeat this process until all rows have one or more valid entries.

In one embodiment, the process iterates over the matrix and marks each entry in the matrix with a priority. In one embodiment, the entry with the largest power value in the matrix is the starting point, and then the process proceeds in decreasing order. In one embodiment, the system removes entries with the largest values, while maintaining 2 values per column and 2 values per row.

In one embodiment, the evaluation process is as follows:
Walk the matrix to produce a test-pattern order.
Start with the cell with the smallest value (in this example, cell 1120, at row 4, column 5, with the value 1.11).
Identify the test patterns associated with the cell (in this example, test-pattern #4 followed by pattern #5, represented by the row and column)
Invalidate all of column #4 as this test pattern is now on the test list.
Look at a row for second test pattern, here row #5, for the smallest value (in this example, cell 1130, row #5, and column #6, with the value 1.19).
Invalidate column #5.
Repeat until the matrix walk is complete.

Choosing the smallest value for the column associated with the smallest value cell will choose the next pattern with lowest power. When the system walks the matrix in this manner, it ends up with a lowest power path, or nearly lowest power path. The lowest power path may not be identified, as identifying the absolute lowest power path is an NP-incomplete problem. However, this process selects a nearly optimal order, even if may not be the absolute lowest possible order.

In one embodiment, the process executes power estimation using each of the tests in the test order and measures the power with the overlapping patterns. It is possible that the test pattern power is different as this is using the actual pattern values for the previous-next pattern rather than a fixed 0x0/0x1 value used earlier in the algorithm. The pattern is loaded through a serial scan chain, so it is possible to calculate the power used during this load by the values each flop will have during the load. However, as the pattern is loaded, the previous pattern is unloaded, in one embodiment at the same time. For example, if the pattern is 1 k flops long—when the system has loaded 500 bits, the first 500 bits of the scan chain are known from this pattern. But the next 500 bits are still set to the values of the previous pattern that is being unloaded, because load and unload both occur at the same time. This means the system cannot easily figure the real power for the unloading part, as that could be any value. The power is flops driving all combo logic in the design. For example, in one design an AND gate is present using flops 500+501. The value at flop 500 is known, since it was just loaded, but the value of flop 501 is unknown. Thus, the system can calculate the power for the N-flops that have been loaded, but has to guess either 0x0 or 0x1 for the remaining flops (not yet loaded, but are being unloaded).

If any pattern pairs exceed the maximum power, the process updates these values in the matrix and repeats the matrix optimization and walk to obtain a new pattern order. This process is repeated as needed until minimum test pattern power is achieved. In this way, the present system provides a method to evaluate power usage for a design, without requiring gate level simulation or emulation.

Figure 12:
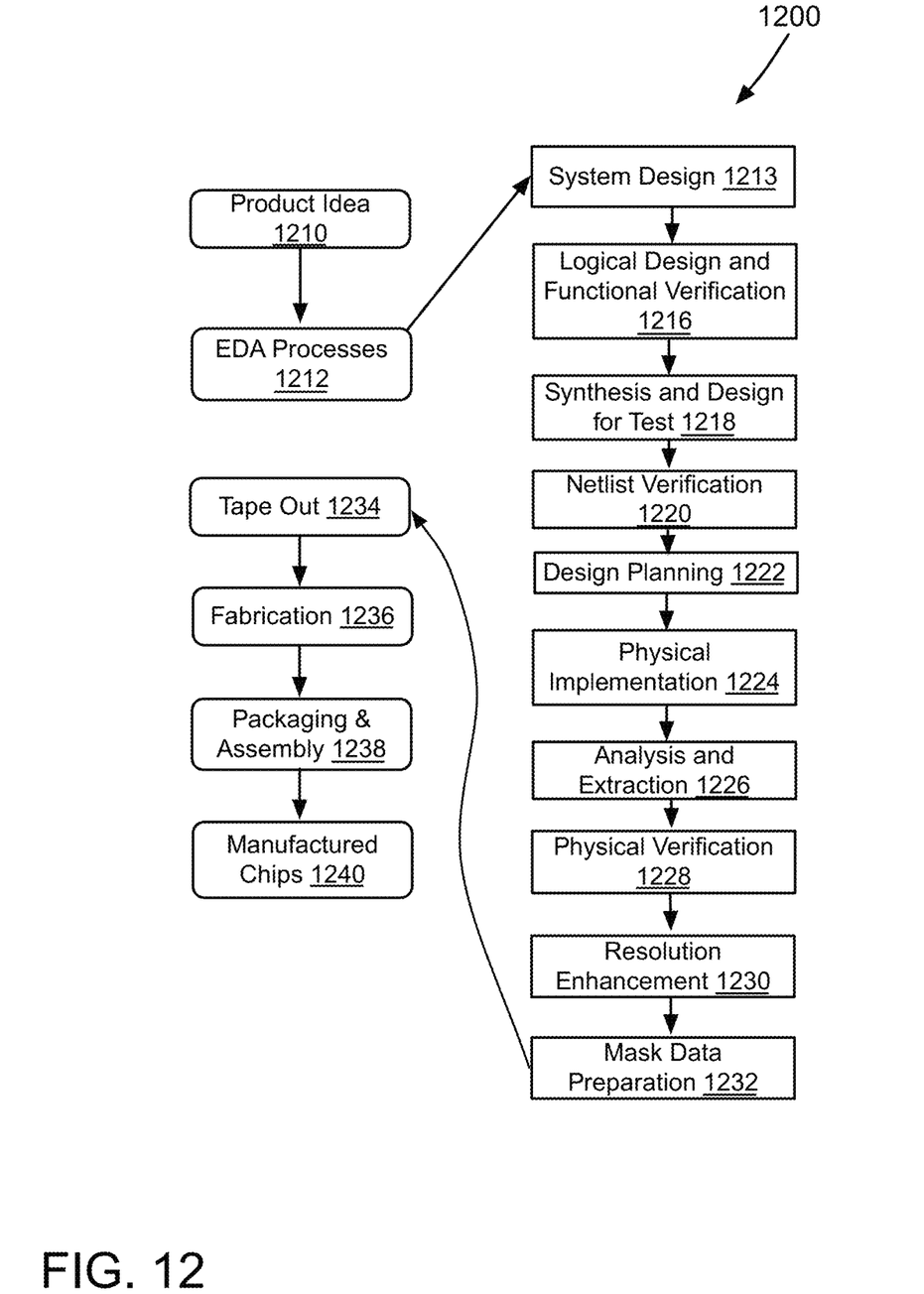
FIG. 12 depicts a flowchart of various processes used during the design and manufacture of an integrated circuit in accordance with some embodiments of the present disclosure.

FIG. 12 illustrates an example set of processes 1200 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1210 with information supplied by a designer, information which is transformed to create an article of manufacture that uses a set of EDA processes 1212. When the design is finalized, the design is taped-out 1234, which is when artwork (e.g., geometric patterns) for the integrated circuit is sent to a fabrication facility to manufacture the mask set, which is then used to manufacture the integrated circuit. After tape-out, a semiconductor die is fabricated 1236 and packaging and assembly processes 1238 are performed to produce the finished integrated circuit 1240.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 12. The processes described by be enabled by EDA products (or tools).

During system design 1214, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1216, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification. In one embodiment, the present power pattern testing falls within the logic design and functional verification 1216.

During synthesis and design for test 1218, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1220, the netlist is checked for compliance with timing constraints and for correspondence with the HDL code. During design planning 1222, an overall floor plan for the integrated circuit is constructed and analyzed for timing and top-level routing.

During layout or physical implementation 1224, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1226, the circuit function is verified at the layout level, which permits refinement of the layout design. During physical verification 1228, the layout design is checked to ensure that manufacturing constraints are correct, such as DRC constraints, electrical constraints, lithographic constraints, and that circuitry function matches the HDL design specification. During resolution enhancement 1230, the geometry of the layout is transformed to improve how the circuit design is manufactured.

During tape-out, data is created to be used (after lithographic enhancements are applied if appropriate) for production of lithography masks. During mask data preparation 1232, the 'tape-out' data is used to produce lithography masks that are used to produce finished integrated circuits.

A storage subsystem of a computer system (such as computer system 1200 of FIG. 12, or host system 1007 of FIG. 10) may be used to store the programs and data structures that are used by some or all of the EDA products described herein, and products used for development of cells for the library and for physical and logical design that use the library.

Figure 13:
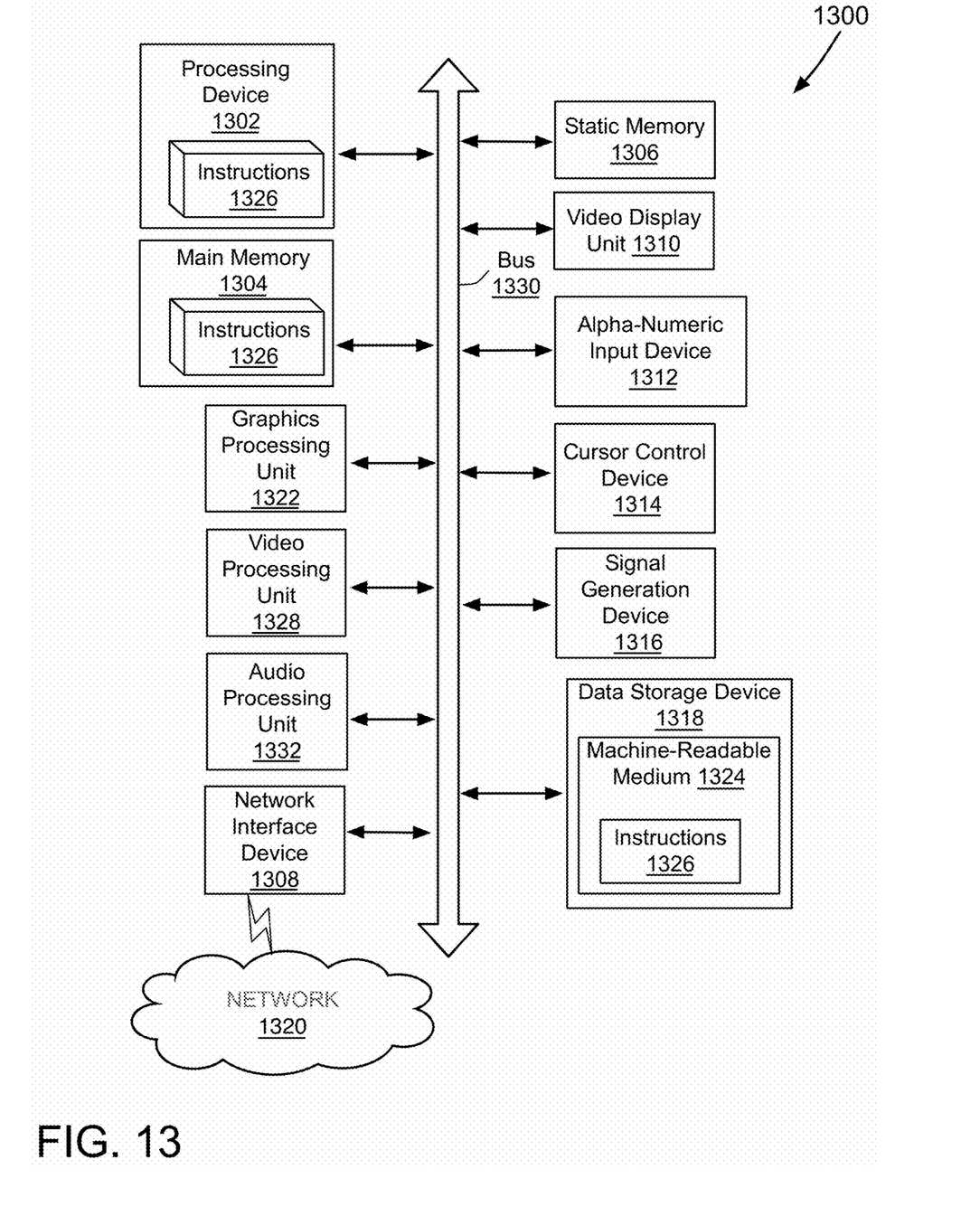
FIG. 13 depicts a diagram of an example computer system in which embodiments of the present disclosure may operate.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM)), a static memory 1306 (e.g., flash memory, static random access memory (SRAM), etc.), and a data storage device 1318, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention.

It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense, and the scope of the present disclosure is defined only by the appended claims.

We claim:

1. A method of power estimation for a portion of an integrated circuit design comprising:
   loading test vectors into a first sequence of flip-flops in scan mode;
   evaluating the test vectors and saving results of the evaluating in a second sequence of flip-flops in scan mode;
   reading the results out of the second sequence of flip-flops to a scan chain; and
   calculating power used by the portion of the integrated circuit design based on the results, the results used to evaluate power for each test vector;
   re-ordering the test vectors; and
   calculating the power for a plurality of orderings of the test vectors.

2. The method of claim 1, wherein the test vectors are loaded using a serial scan chain.

3. The method of claim 1, further comprising:
   providing the test vectors for a power test analysis, the test vectors comprising initial values for a plurality of elements in the integrated circuit design, such that no gate level simulation is used.

4. The method of claim 3, further comprising:
   generating the test vectors for patterns of interest, for evaluation by the power test analysis.

5. The method of claim 1, wherein:
   the test vectors are concatenated to form a series of scan tests; and
   each of the test vectors overlaps with a next set of the test vectors and a preceding set of the test vectors.

6. The method of claim 1, wherein the power for the plurality of orderings are calculated using a power matrix.

7. The method of claim 6, further comprising:
   removing elements from the power matrix that represent a power level above a threshold.

8. The method of claim 7, further comprising:
   iterating an evaluation over the power matrix and marking each entry in the power matrix with a priority, such that a largest power value in the power matrix is a starting point.

9. A power estimation system for a portion of an integrated circuit design comprising:
   a scan logic configured to load test vectors into a first sequence of flip-flops in scan mode;
   a processor configured to evaluate the test vectors and save results of the evaluating in a second sequence of flip-flops in scan mode;
   the scan logic further configured to read the results out of the second sequence of flip-flops to a scan chain; and
   the processor further configured to:
      calculate power used by the portion of the integrated circuit design based on the results,
      evaluate power for each test vector,
      re-order the test vectors, and
      calculate the power for a plurality of orderings of the test vectors.

10. The system of claim 9, further comprising:
    a serial scan chain, wherein the test vectors are loaded using the serial scan chain.

11. The system of claim 9, further comprising:
    the processor further configured to provide initial states for elements of the integrated circuit design, the initial states comprise the test vectors, such that no gate level simulation is used.

12. The system of claim 11, wherein the processor is further configured to generate the test vectors for patterns of interest, for evaluation by a power test analysis.

13. The system of claim 9, wherein the test vectors are concatenated to form a series of scan tests, and each of the test vectors overlaps with a next set of the test vectors and a preceding set of the test vectors.

14. The system of claim 9, wherein the power for the plurality of orderings are calculated using a power matrix.

15. The system of claim 14, further comprising:
    the processor further configured to remove elements from the power matrix that represent a power level above a threshold.

16. A power estimation system comprising:
    a processor configured to generate test vectors for a plurality of elements in a circuit for a selected pattern for evaluation;
    the processor further configured to receive the test vectors and:
       load test vectors, into a first sequence of flip-flops in scan mode;
       evaluate the test vectors and save results of the evaluating in a second sequence of flip-flops in scan mode;
       read the results out of the second sequence of flip-flops to a scan chain; and
       calculate power generation based on the results, evaluate power for each test vector, re-order the test vectors, and calculate the power for a plurality of orderings of the test vectors.

17. The system of claim 16, wherein the processor receives as an input a selected one or more cycles for evaluation.

18. The system of claim 16, further comprising:
    the processor further configured to select paired patterns from a power matrix, the power matrix including power values for all combinations of patterns, wherein the matrix logic selects lowest power pattern combinations.

19. The system of claim 18, further comprising:
    the processor further configured to remove elements from the power matrix that represent a power level above a threshold.

* * * * *